(12) United States Patent
Then et al.

(10) Patent No.: US 11,335,800 B2
(45) Date of Patent: May 17, 2022

(54) WORK FUNCTION BASED APPROACHES TO TRANSISTOR THRESHOLD VOLTAGE TUNING

(71) Applicant: Intel Corporation, Santa Clara, CA (US)

(72) Inventors: Han Wui Then, Portland, OR (US); Marko Radosavljevic, Portland, OR (US); Sansaptak Dasgupta, Hillsboro, OR (US); Paul Fischer, Portland, OR (US); Walid Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 818 days.

(21) Appl. No.: 16/016,411

(22) Filed: Jun. 22, 2018

(65) Prior Publication Data
US 2019/0393332 A1 Dec. 26, 2019

(51) Int. Cl.
*H01L 29/20* (2006.01)
*H01L 29/778* (2006.01)
*H01L 29/205* (2006.01)
*H01L 21/02* (2006.01)
*H01L 29/66* (2006.01)
*H01L 29/08* (2006.01)
*H01L 29/423* (2006.01)
*H01L 29/49* (2006.01)
*H01L 27/088* (2006.01)
*H01L 21/8252* (2006.01)

(52) U.S. Cl.
CPC ...... *H01L 29/7787* (2013.01); *H01L 21/0254* (2013.01); *H01L 29/0847* (2013.01); *H01L 29/2003* (2013.01); *H01L 29/205* (2013.01); *H01L 29/6656* (2013.01); *H01L 29/66462* (2013.01); *H01L 29/66545* (2013.01); *H01L 21/0217* (2013.01); *H01L 21/02164* (2013.01); *H01L 21/8252* (2013.01); *H01L 27/0883* (2013.01); *H01L 29/42376* (2013.01); *H01L 29/495* (2013.01); *H01L 29/4966* (2013.01)

(58) Field of Classification Search
CPC .................................................. H01L 29/7787
See application file for complete search history.

(56) References Cited

U.S. PATENT DOCUMENTS

2016/0300835 A1* 10/2016 Xia .................. H01L 29/66734
2017/0047412 A1* 2/2017 Tanaka ................ H01L 29/7783

* cited by examiner

*Primary Examiner* — Matthew L Reames
(74) *Attorney, Agent, or Firm* — Schwabe, Williamson & Wyatt, P.C.

(57) ABSTRACT

A semiconductor device is disclosed. The semiconductor device includes a substrate, an epitaxial layer on the substrate, a semiconductor interlayer on top of the epitaxial layer, a gate conductor above the semiconductor interlayer, a gate insulator on the bottom and sides of the gate conductor and contacting the top surface of the semiconductor interlayer, a source region extending into the epitaxial layer, and a drain region extending into the epitaxial layer. The semiconductor device also includes a first polarization layer on the semiconductor interlayer between the source region and the gate conductor and a second polarization layer on the semiconductor interlayer between the drain region and the gate conductor.

20 Claims, 6 Drawing Sheets

WORK FUNCTION BASED APPROACHES TO TRANSISTOR THRESHOLD VOLTAGE TUNING

TECHNICAL FIELD

Embodiments of the disclosure are in the field of semiconductor structures and processing and, in particular, work function based approaches to transistor threshold voltage tuning.

BACKGROUND

Monolithically integrated enhancement/depletion (E/D) mode transistors are being developed for high-speed mixed-signal applications. Mixed-signal integrated circuits (ICs) are more difficult to design and manufacture than analog-only or digital-only integrated circuits. Some mixed-signal ICs include multiple transistors on the same wafer that require different threshold voltages.

Setting the threshold voltages of multiple transistors on the same wafer to different magnitudes requires the threshold voltages of the individual transistors to be tuned. An unprecedented level of process control is required to reliably set the threshold voltages of multiple transistors on the same wafer to different magnitudes. Controlling threshold voltages in GaN transistors is especially challenging because of the formation of 2DEG in the transistor channel by an epitaxial polarization layer which is grown on the GaN. Transistor threshold voltage is sensitive to 2DEG underneath the gate.

Previous approaches to setting the threshold voltages of multiple transistors on the same wafer to different magnitudes involve etching the polarization layer to eliminate the 2DEG under the transistor channel. The etching of the polarization layer is usually done using a dry plasma etch which is difficult to stop. The process is even more difficult to control when the polarization layer thickness and etch rate are non-uniform across the wafer. For example, using the same etching methodology to etch the polarization layer at different places on the wafer can provide distinctly different results. Thus, the previous approaches to setting the threshold voltages of multiple transistors on the same wafer to different magnitudes that involve etching the polarization layer to tune the threshold voltages of the multiple transistors, have proven less than satisfactory.

DESCRIPTION OF THE EMBODIMENTS

Figure 1:
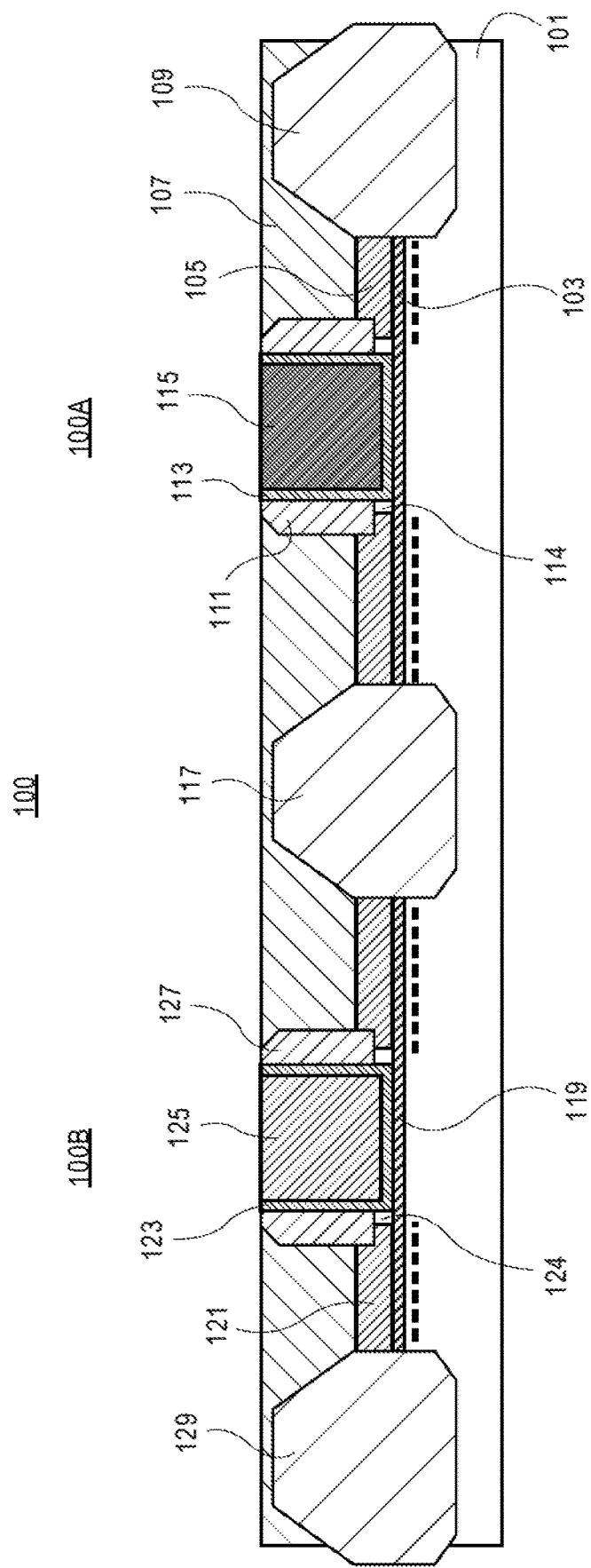
FIG. 1 is an illustration of a semiconductor structure that includes enhancement mode and depletion mode transistors with tuned threshold voltages according to an embodiment.

Work function based approaches to transistor threshold voltage tuning are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Previous approaches to setting or "tuning" the threshold voltages of multiple transistors on the same wafer to different magnitudes have proven inadequate. Approaches that involve etching the polarization layer are challenging because of the inability to precisely control the extent of the etching. Moreover, because the thickness of the polarization layer can vary across a wafer (e.g., from process variation) using the same etching methodology to etch the polarization layer at different places on the wafer can provide different results. A process and device that addresses the shortcomings of such previous approaches is disclosed herein. As part of the disclosed process, a polarization layer is not grown underneath the gate of the transistor where threshold voltage is sensitive to its presence. The polarization layer is grown in the gate-to-source and gate-to-drain regions of the transistor where it is required. At these extrinsic regions, the presence and/or thickness of the polarization layer no longer affects the threshold voltage. As such, the primary modulator of the threshold voltage is the work function of the gate conductor. A gate conductor is chosen to provide the desired threshold voltage.

FIG. 1 is an illustration of a semiconductor structure 100 that includes integrated depletion mode transistor 100A and enhancement mode transistor 100B. In an embodiment, the threshold voltages of the depletion mode transistor 100A and the enhancement mode transistor 100B are tuned to different magnitudes using work function tuning according to an embodiment. In FIG. 1, the depletion mode transistor 100A includes epitaxial layer 101, semiconductor interlayer 103, polarization layer 105, insulator 107, source region 109, spacer 111, gate insulator 113, oxide 114, gate conductor 115, and drain region 117. In FIG. 1, the enhancement mode transistor 100B includes, in addition to structures shared with the depletion mode transistor 100A, semiconductor interlayer 119, polarization layer 121, gate insulator 123, oxide 124, gate conductor 125, spacers 127 and source region 129.

Referring to FIG. 1, in the region of depletion mode transistor 100A, the epitaxial layer 101 is formed above a substrate (not shown). Semiconductor interlayer 103 is formed above the epitaxial layer 101. The polarization layer is formed above the semiconductor interlayer 103. The source region 109 is formed in a space in the epitaxial layer 101 that extends below the top surface of the epitaxial layer 101. The gate 115 is formed in a trench that is partially defined by the spacers 111. The trench is lined with the gate insulator 113. The spacers 111 are formed adjacent the sides of the gate 115 on the gate insulator 113. The oxide 114 is formed underneath the spacers 111. The drain region 117 is formed in a space in the epitaxial layer 101 that extends below the top surface of the epitaxial layer 101.

In the region of the enhancement mode transistor 100B, the polarization layer 121 is formed above the semiconductor interlayer 119. The source region 129 is formed in a space in the epitaxial layer 101 that extends below the top surface of the epitaxial layer 101. The gate 125 is formed in a trench that is partially defined by the spacers 127. The trench is lined with gate insulator 123. The spacers 127 are formed adjacent the sides of the gate 125 on the gate insulator 123. The oxide 124 is formed underneath the spacers 127.

In an embodiment, the epitaxial layer 101 can be formed from GaN. In other embodiments, the epitaxial layer 101 can be formed from other materials. In an embodiment, the semiconductor interlayer 103 can be formed from AlN. In other embodiments, the semiconductor interlayer 103 can be formed from other materials. In an embodiment, the polarization layer 105 can be formed from AlInGaN. In other embodiments, the polarization layer 105 can be formed from other materials. In an embodiment, the insulator 107 can be formed from SiO2. In other embodiments, the insulator 107 can be formed from other materials. In an embodiment, the source region 109 can be formed from InGaN. In other embodiments, the source region 109 can be formed from other materials. In an embodiment, the spacer 111 can be formed from SiN. In other embodiments, the spacer 111 can be formed from other material. In an embodiment, the gate insulator 113 can be formed from a high-k material. In other embodiment, the gate insulator 113 can be formed from a low-k material. In an embodiment, the gate 115 is formed from an n-type work function conductor. For example, in an embodiment, the gate 115 can be formed from materials that include Al, Ti, TiAl, TiAlN, Ta and TaN. In other embodiments, the gate 115 can be formed from other n-type work function conductors. In an embodiment, the drain region 117 can be formed from InGaN. In other embodiments, the drain region 117 can be formed from other materials. In an embodiment, the semiconductor interlayer 119 can be formed from AlN. In other embodiments, the semiconductor interlayer 119 can be formed from other materials. In an embodiment, the polarization layer 121 can be formed from AlInGaN. In other embodiments, the polarization layer 121 can be formed from other materials. In an embodiment, the gate insulator 123 can be formed from a high-k material. In other embodiments, the gate insulator can be formed from a low-k material. In an embodiment, the gate 125 can be formed from a p-type work function conductor. For example, in an embodiment, the gate 125 can be formed from p-type work function metals that include but are not limited to TiN, Ni, Pt and W. In other embodiments, the gate 125 can be formed from other p-type work function metals. In an embodiment, the spacers 127 can be formed from SiN. In other embodiments, the spacers 127 can be formed from other materials. In an embodiment, the source region 129 can be formed from InGaN. In other embodiments, the source region 129 can be formed from other materials.

In operation, when a voltage (negative potential with respect to the source) that is applied to the gate 115 of the depletion mode transistor 100A is below the threshold voltage of the depletion mode transistor 100A, the depletion mode transistor 100A is turned off. In addition, when a voltage that is applied to the gate 125 of the enhancement mode transistor 100B exceeds the threshold voltage of the enhancement mode transistor 100B, the enhancement mode transistor 100B is turned on. In an embodiment, the threshold voltage of the transistor 100A is less than zero and the threshold voltage of the transistor 100B is greater than zero. Because of the effectiveness of work function based targeting of threshold voltages described herein, the depletion mode transistor 100A and the enhancement mode transistor 100B are more likely to operate as predicted. In an embodiment, the capacity to accurately set the threshold voltages for integrated enhancement mode and depletion mode transistors to different magnitudes, enables the use of such transistors in RF products that rely on both enhancement mode transistors and depletion mode transistors. In an embodiment, the threshold voltage is set by the work function of the metal that is used for the gate conductor of the transistors and is not affected by polarization layer material because of the absence of such under the gates of the transistors. The capacity to tune the threshold voltage based on a selection of the gate conductor enables the threshold voltage to be reliably set to a level that is suitable for desired applications. Embodiments enable fabrication processes that produce a higher proportion of enhancement mode and depletion mode transistors on a wafer that operate properly (e.g., higher yield). In an embodiment, higher yields can result in significant production cost savings.

FIGS. 2A-2G are illustrations of cross-sections of a semiconductor structure 200 under fabrication that includes enhancement mode and depletion mode transistors according to an embodiment.

Figure 2A:
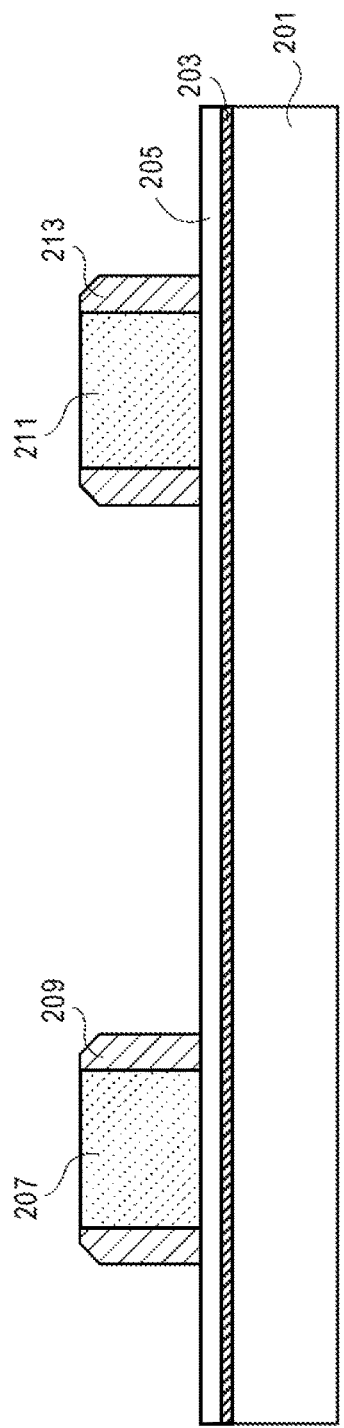
FIGS. 2A-2G are illustrations of cross-sections of a semiconductor structure under fabrication that includes enhancement mode and depletion mode transistors with tuned threshold voltages according to an embodiment.

Referring to FIG. 2A, after a plurality of operations, the semiconductor structure 200 has the cross-section shown in FIG. 2A. As part of those operations, an epitaxial layer of gallium nitride 201 is formed on a substrate (not shown), a semiconductor interlayer of aluminum nitride 203 is formed above the epitaxial layer of gallium nitride 201, a layer of oxide 205 is formed above the semiconductor interlayer of aluminum nitride 203, a dummy gate 207 and a dummy gate 211 are formed on the layer of oxide 203, and spacers 209 and spacers 213 are formed to bracket the dummy gate 207 and the dummy gate 211 respectively. In other embodiments, other materials can be used to form the aforementioned layers and/or structures.

Figure 2B:
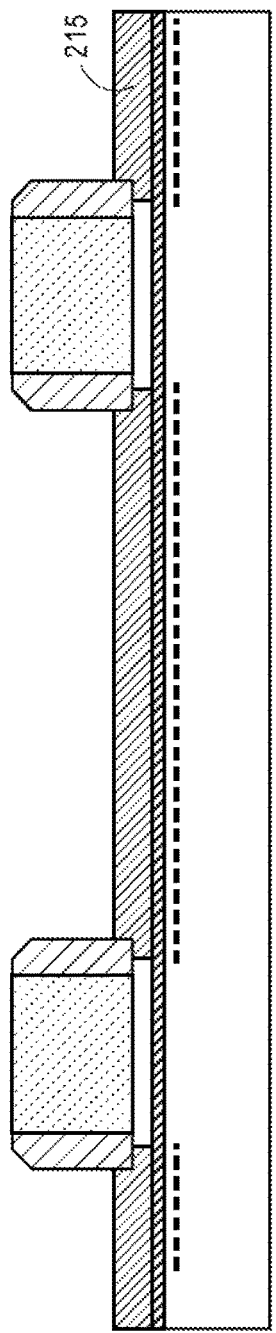

Referring to FIG. 2B, after one or more operations that result in the cross-section shown in FIG. 2A, the oxide is undercut and a polarization layer 215 is formed on top of the semiconductor interlayer 203. In an embodiment, the polarization layer 215 can be formed from aluminum indium gallium nitride. In other embodiments, the polarization layer 215 can be formed from other materials.

Figure 2C:
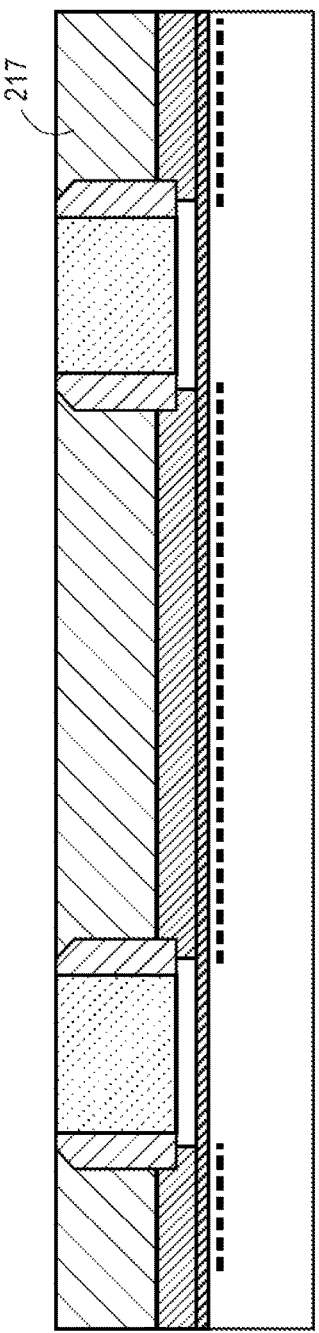

Referring to FIG. 2C, after one or more operations that result in the cross-section shown in FIG. 2B, dielectric material 217 is formed on the top surface of the semiconductor device structure 200. In an embodiment, the dielectric material 217 can be formed from silicon dioxide. In other embodiments, the dielectric material 217 can be formed from other material.

Figure 2D:
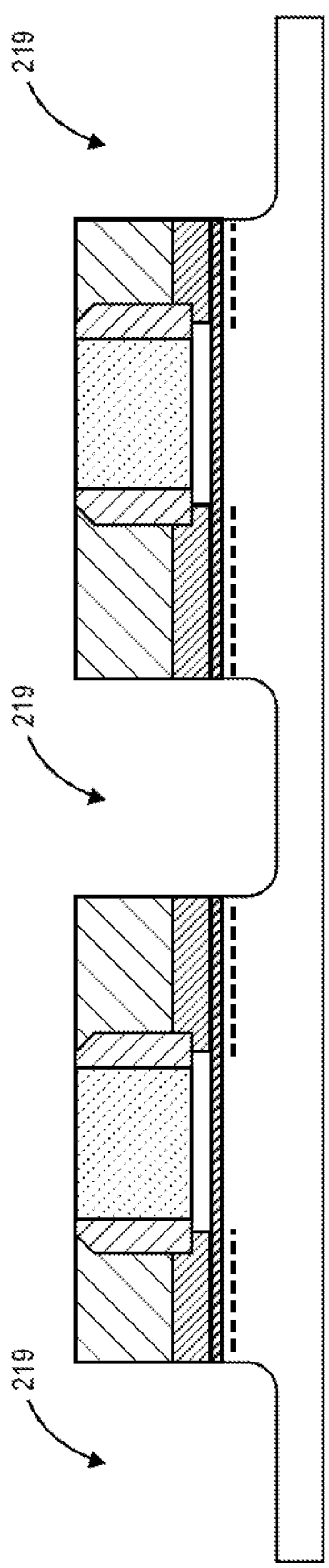

Referring to FIG. 2D, after one or more operations that result in the cross-section shown in FIG. 2C, trenches 219 are formed that extend into the epitaxial layer 201 through the material that is formed above the epitaxial layer 201.

Figure 2E:
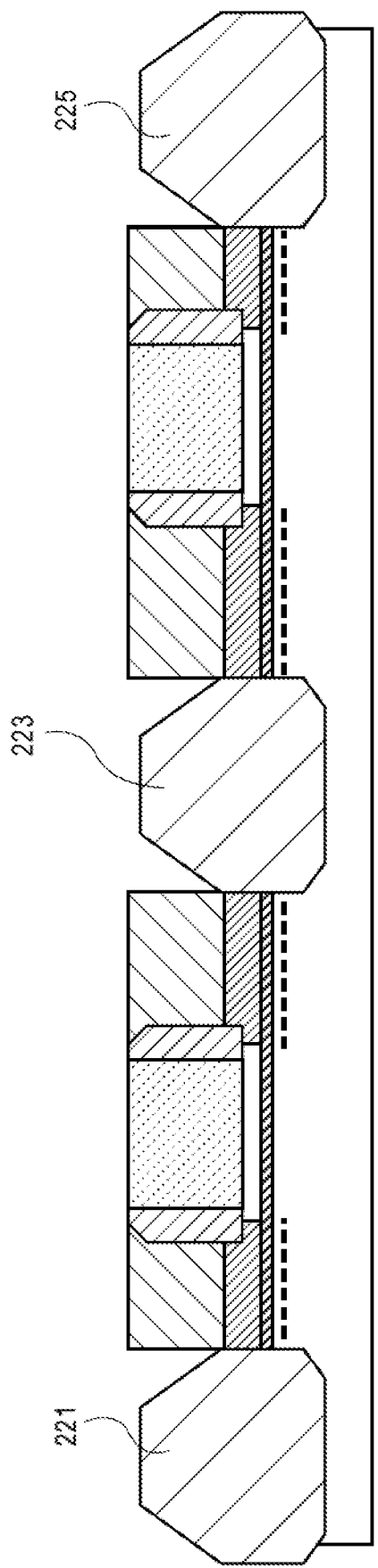

Referring to FIG. 2E, after one or more operations that result in the cross-section shown in FIG. 2D, epitaxial material 225 is formed in the trenches 219. The epitaxial material is used to form source and drain regions 221, 223 and 225 of the semiconductor structure 200. In an embodiment, the source and the drain regions 221, 223 and 225 are formed from indium gallium nitride. In other embodiments, the source and the drain regions can be formed from other materials.

Figure 2F:
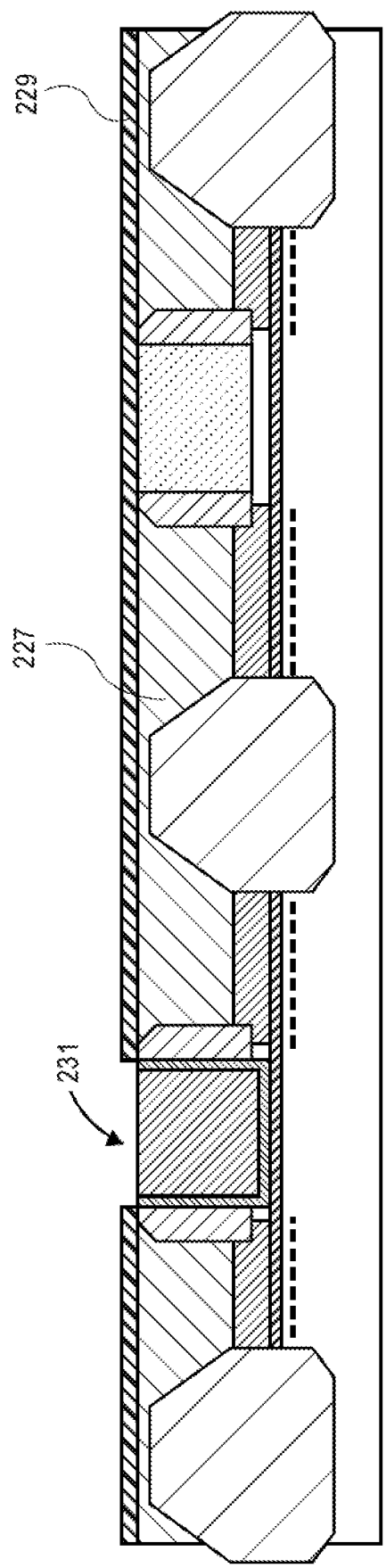

Referring to FIG. 2F, after one or more operations that result in the cross-section shown in FIG. 2E, the dummy gate 207 is replaced with a p-type work function gate metal 231 for the enhancement mode transistor. Before the dummy gate 207 is replaced, spaces in the insulator layer 217 are filled and the top surface of the semiconductor structure 200 is planarized. A mask is formed on the top surface of the semiconductor structure 200 after spaces in the insulator 217 have been filled and the top surface of semiconductor structure 200 is planarized to expose the dummy gate 207.

Figure 2G:
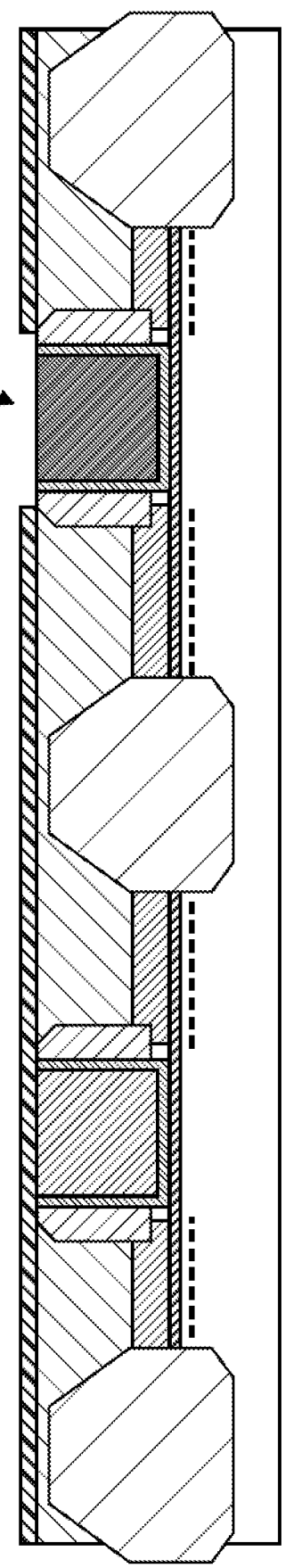

Referring to FIG. 2G, after one or more operations that result in the cross-section shown in FIG. 2F, the dummy gate 211 is replaced with an n-type work function gate metal 233 for the depletion mode transistor. Before the dummy gate 211 is replaced, the part of the mask 229 that covers the dummy gate 211 on the top surface of the semiconductor structure 200 is removed such that the dummy gate 211 is exposed.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a depletion mode or an enhancement mode transistor. In some implementations, the gate electrode layer may consist of a stack of two or more metal layers, where one or more metal layers are workfunction metal layers and at least one metal layer is a fill metal layer.

For an enhancement mode transistor, metals that may be used for the gate electrode include, but are not limited to, ruthenium, palladium, platinum, cobalt, nickel, and conductive metal oxides, e.g., ruthenium oxide. A P-type metal layer will enable the formation of an enhancement mode gate electrode with a workfunction that is between about 4.9 eV and about 5.2 eV. For a depletion mode transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of a depletion mode gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, suitable dopants such as silicon, germanium, boron, aluminum, antimony, phosphorous, or arsenic may be ion-implanted into the substrate to form the source and drain regions. In an embodiment, if the source and drain regions are composed of InGaN, silicon and germanium are suitable n-type donors. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using an InGaN alloy. In some other implementations, a silicon alloy such as silicon germanium or silicon carbide can be used. In some implementations the epitaxially deposited source and drain regions may be doped in situ with dopants such as silicon, germanium, boron, arsenic, or phosphorous. In further embodiments, the source and drain regions may be formed using one or more alternate semiconductor materials such as a group IV material or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 3:
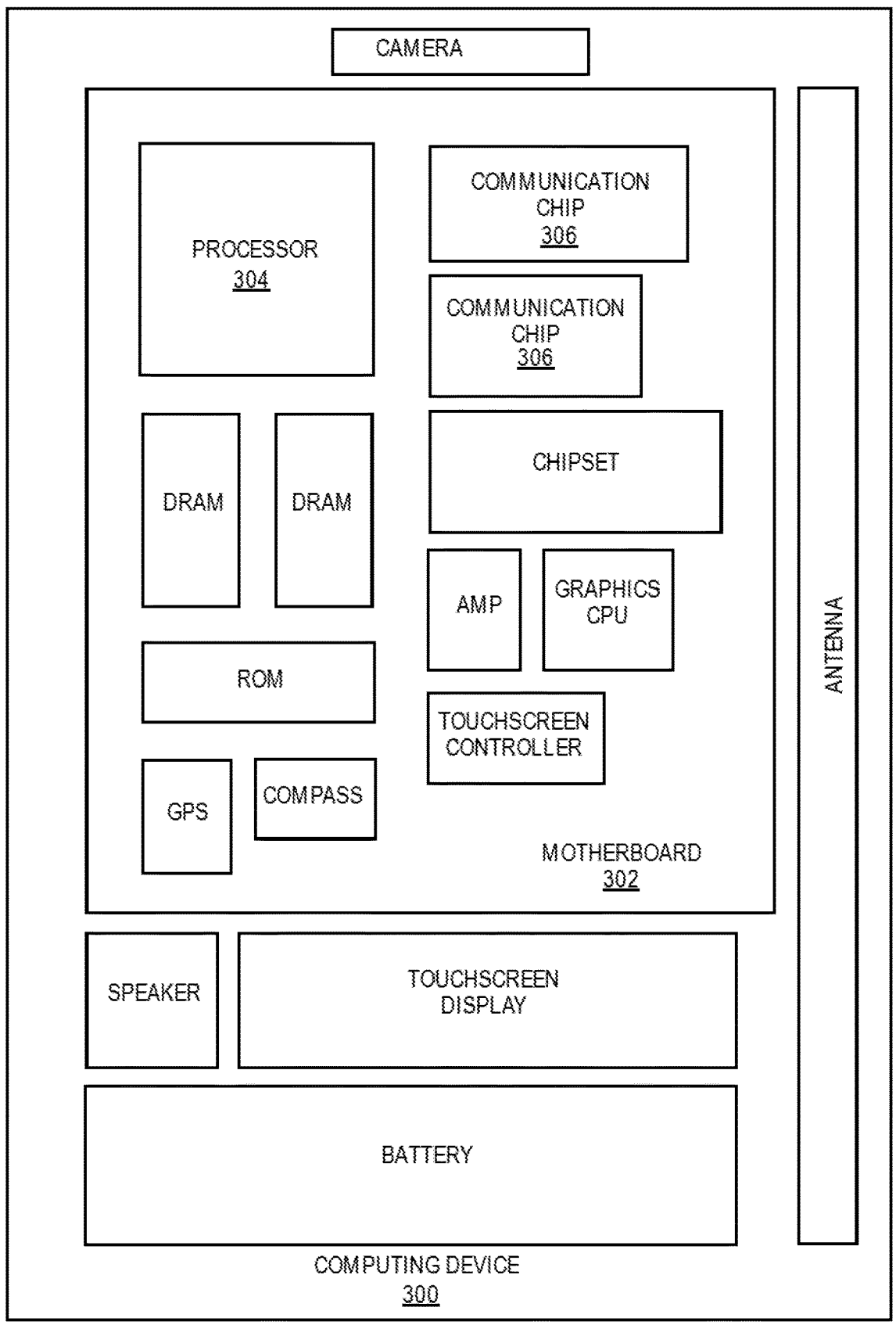
FIG. 3 illustrates a computing device in accordance with one implementation of an embodiment.

FIG. 3 illustrates a computing device 300 in accordance with one implementation of an embodiment. The computing device 300 houses a board 302. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In accordance with another implementation of the invention, the integrated circuit die of the communication chip includes one or more devices, such as MOS-FET transistors built in accordance with implementations of the invention.

In further implementations, another component housed within the computing device 300 may contain an integrated circuit die that includes one or more devices, such as MOS-FET transistors built in accordance with implementations of the invention.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

Figure 4:
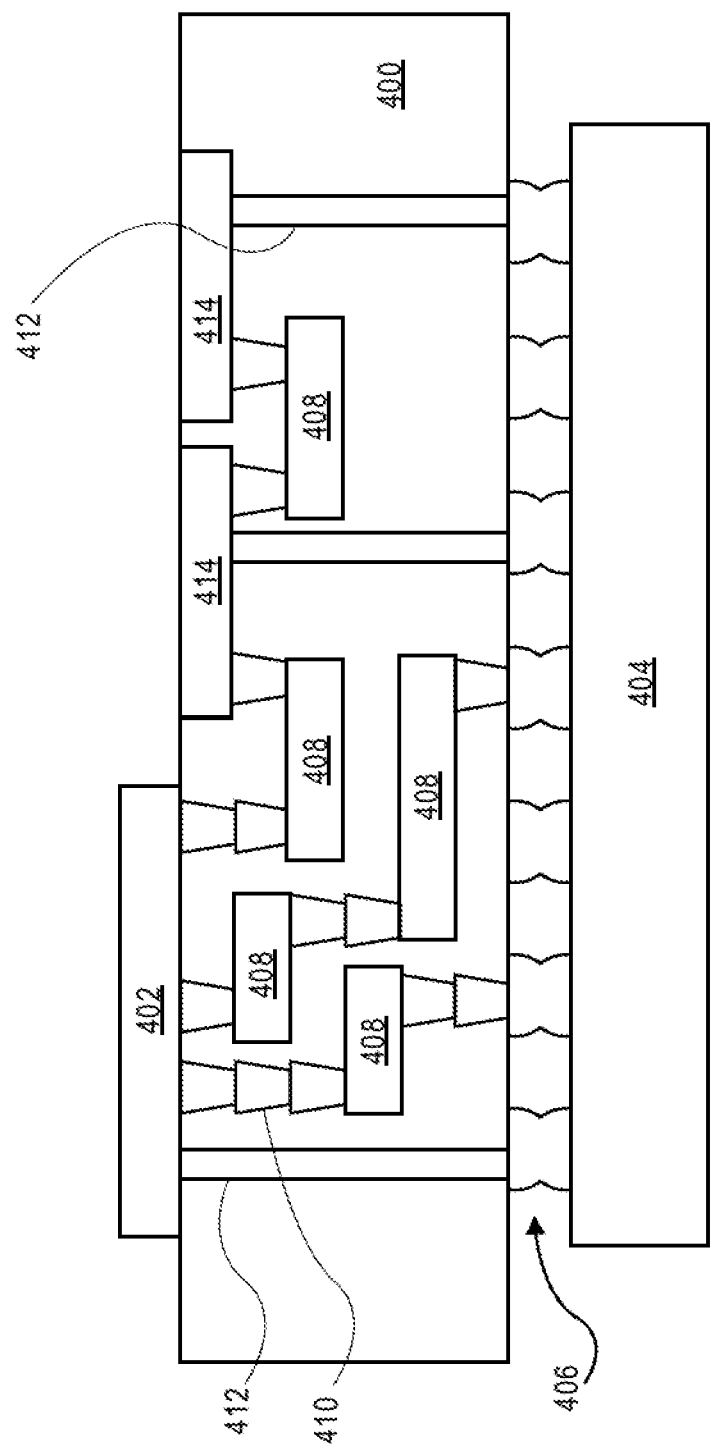
FIG. 4 illustrates an interposer that includes one or more embodiments.

FIG. 4 illustrates an interposer 400 that includes one or more embodiments. The interposer 400 is an intervening substrate used to bridge a first substrate 402 to a second substrate 404. The first substrate 402 may be, for instance, an integrated circuit die. The second substrate 404 may be, for instance, a memory module, a computer motherboard, or another integrated circuit die. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400. In accordance with embodiments of the invention, apparatuses or processes disclosed herein may be used in the fabrication of interposer 400.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

A semiconductor device includes a substrate, an epitaxial layer on the substrate, a semiconductor interlayer on top of the epitaxial layer, a gate conductor above the semiconductor interlayer, a gate insulator on the bottom and sides of the gate conductor and contacting the top surface of the semiconductor interlayer, a source region extending into the epitaxial layer, and a drain region extending into the epitaxial layer. The semiconductor device also includes a first polarization layer on the semiconductor interlayer between the source region and the gate conductor and a second polarization layer on the semiconductor interlayer between the drain region and the gate conductor.

Example Embodiment 2

The semiconductor device of example embodiment 1, wherein the first polarization layer and the second polarization layer includes portions that extend respectively below a first spacer and a second spacer.

Example Embodiment 3

The semiconductor device of example embodiment 1, wherein the semiconductor device is an enhancement mode transistor.

Example Embodiment 4

The semiconductor device of example embodiment 1, wherein the semiconductor device is a depletion mode transistor.

Example Embodiment 5

The semiconductor device of example embodiment 1, wherein the epitaxial layer comprises GaN.

Example Embodiment 6

The semiconductor device of example embodiment 1, wherein the polarization layer is AlInGaN.

Example Embodiment 7

The semiconductor device of example embodiments 1, 2, 3, 4, 5 or 6 wherein the source region and the drain region comprise n-type material.

Example Embodiment 8

A semiconductor device, comprising an enhancement mode transistor, comprising, a first gate conductor above a first semiconductor interlayer, and a first polarization layer on the first semiconductor interlayer between a first source region and the first gate conductor and a second polarization layer on the semiconductor interlayer between a drain region and the first gate conductor, a depletion mode transistor, comprising, a second gate conductor above a second semiconductor interlayer, and a third polarization layer on the second semiconductor interlayer between a second source region and the second gate conductor and a fourth polarization layer on the semiconductor interlayer between the drain region and the second gate conductor.

Example Embodiment 9

The semiconductor device of example embodiment 8, wherein the first polarization layer, the second polarization layer, the third polarization layer and the fourth polarization layer extend respectively below a first spacer, a second spacer, a third spacer and a fourth spacer.

Example Embodiment 10

The semiconductor device of example embodiment 8, wherein the threshold voltage of the enhancement mode transistor is greater than zero.

Example Embodiment 11

The semiconductor device of example embodiment 8, wherein the threshold voltage of the depletion mode transistor is less than zero.

Example Embodiment 12

The semiconductor device of example embodiment 8, wherein the epitaxial layer comprises GaN.

Example Embodiment 13

The semiconductor device of example embodiment 8, wherein the polarization layer is AlInGaN.

Example Embodiment 14

The semiconductor device of example embodiments 8, 9, 10, 11, 12 or 13 wherein the source region and the drain region comprise n-type material.

Example Embodiment 15

A method including forming an epitaxial layer on a substrate, forming a semiconductor interlayer on top of the substrate, forming a gate conductor above the semiconductor interlayer, forming a gate insulator on the bottom and sides of the gate conductor that contacts the top surface of the semiconductor interlayer, forming a source region extending into the epitaxial layer, forming a drain region extending into the epitaxial layer, and forming a first polarization layer on the semiconductor interlayer between the source region and the gate conductor and a second polarization layer on the semiconductor interlayer between the drain region and the gate conductor.

Example Embodiment 16

The method of example embodiment 15, wherein the first polarization layer and the second polarization layer extend respectively below a first spacer and a second spacer.

Example Embodiment 17

The method of example embodiment 15, wherein the semiconductor device is an enhancement mode transistor.

Example Embodiment 18

The method of example embodiment 15, wherein the semiconductor device is a depletion mode transistor.

Example Embodiment 19

The method of example embodiment 15, wherein the epitaxial layer comprises GaN.

Example Embodiment 20

The method of example embodiments 15, 16, 17, 18 or 19 wherein the polarization layer is AlInGaN.

What is claimed is:

1. A semiconductor device, comprising:
    a substrate;
    an epitaxial layer above the substrate, the epitaxial layer having a top surface;
    a semiconductor interlayer above the epitaxial layer;
    a gate conductor above the semiconductor interlayer;
    a gate insulator on the bottom and sides of the gate conductor and contacting the top surface of the semiconductor interlayer;
    an epitaxial source structure extending into the epitaxial layer, the epitaxial source structure having a bottom surface below the top surface of the epitaxial layer, and the epitaxial source structure having a top surface above the top surface of the epitaxial layer;
    an epitaxial drain structure extending into the epitaxial layer, the epitaxial drain structure having a bottom surface below the top surface of the epitaxial layer, and the epitaxial drain structure having a top surface above the top surface of the epitaxial layer; and
    a first polarization layer on the semiconductor interlayer between the epitaxial source structure and the gate conductor, and a second polarization layer on the semiconductor interlayer between the epitaxial drain structure and the gate conductor.

2. The semiconductor device of claim 1, wherein the first polarization layer and the second polarization layer includes portions that extend respectively below a first spacer and a second spacer.

3. The semiconductor device of claim 1, wherein the semiconductor device is an enhancement mode transistor.

4. The semiconductor device of claim 1, wherein the semiconductor device is a depletion mode transistor.

5. The semiconductor device of claim 1, wherein the epitaxial layer comprises GaN.

6. The semiconductor device of claim 1, wherein the polarization layer is AlInGaN, AlInN, AlGaN or AlN.

7. The semiconductor device of claim 1, wherein the epitaxial source structure and the epitaxial drain structure comprise n-type material.

8. A semiconductor device, comprising:
    an enhancement mode transistor, comprising:
        a first gate conductor above a first semiconductor interlayer, the first semiconductor interlayer above an epitaxial layer, the epitaxial layer having a top surface; and
        a first polarization layer on the first semiconductor interlayer between a first epitaxial source structure and the first gate conductor, and a second polarization layer on the first semiconductor interlayer between an epitaxial drain structure and the first gate conductor, the first epitaxial source structure having a bottom surface below the top surface of the epitaxial layer, the first epitaxial source structure having a top surface above the top surface of the epitaxial layer, the epitaxial drain structure having a bottom surface below the top surface of the epitaxial layer, and the epitaxial drain structure having a top surface above the top surface of the epitaxial layer; and
    a depletion mode transistor, comprising:
        a second gate conductor above a second semiconductor interlayer, the second semiconductor interlayer above the epitaxial layer; and
        a third polarization layer on the second semiconductor interlayer between a second epitaxial source structure and the second gate conductor, and a fourth polarization layer on the semiconductor interlayer between the epitaxial drain structure and the second gate conductor, the second epitaxial source structure having a bottom surface below the top surface of the epitaxial layer, and the second epitaxial source structure having a top surface above the top surface of the epitaxial layer.

9. The semiconductor device of claim 8, wherein the first polarization layer, the second polarization layer, the third polarization layer and the fourth polarization layer extend respectively below a first spacer, a second spacer, a third spacer and a fourth spacer.

10. The semiconductor device of claim 8, wherein the threshold voltage of the enhancement mode transistor is greater than zero.

11. The semiconductor device of claim 8, wherein the threshold voltage of the depletion mode transistor is less than zero.

12. The semiconductor device of claim 8, wherein the epitaxial layer comprises GaN.

13. The semiconductor device of claim 8, wherein the polarization layer comprises AlInGaN, AlInN, AlGaN or AlN.

14. The semiconductor device of claim 8, wherein the epitaxial source structure and the epitaxial drain structure comprise n-type material.

15. A method, comprising:

forming an epitaxial layer above a substrate, the epitaxial layer having a top surface;

forming a semiconductor interlayer above the epitaxial layer;

forming a gate conductor above the semiconductor interlayer;

forming a gate insulator on the bottom and sides of the gate conductor and contacting the top surface of the semiconductor interlayer;

forming an epitaxial source structure extending into the epitaxial layer, the epitaxial source structure having a bottom surface below the top surface of the epitaxial layer, and the epitaxial source structure having a top surface above the top surface of the epitaxial layer;

forming an epitaxial drain structure extending into the epitaxial layer, the epitaxial drain structure having a bottom surface below the top surface of the epitaxial layer, and the epitaxial drain structure having a top surface above the top surface of the epitaxial layer; and forming a first polarization layer on the semiconductor interlayer between the source region and the gate conductor and a second polarization layer on the semiconductor interlayer between the drain region and the gate conductor.

16. The method of claim 15, wherein the first polarization layer and the second polarization layer extend respectively below a first spacer and a second spacer.

17. The method of claim 15, wherein the semiconductor device is an enhancement mode transistor.

18. The method of claim 15, wherein the semiconductor device is a depletion mode transistor.

19. The method of claim 15, wherein the epitaxial layer comprises GaN.

20. The method of claim 15, wherein the polarization layer is AlInGaN, AlInN, AlGaN or AlN.

* * * * *